United States Patent [19]

Heinz et al.

[11] Patent Number: 5,068,915
[45] Date of Patent: Nov. 26, 1991

[54] SERIES EVAPORATOR FOR VACUUM VAPOR-DEPOSITION APPARATUS

[75] Inventors: Jochen Heinz, Linden; Thomas Krug, Hanau; Klemens Ruebsam, Jossgrund; Hans Kessler, Hanau, all of Fed. Rep. of Germany

[73] Assignee: Leybold Aktiengesellschaft, Hanau, Fed. Rep. of Germany

[21] Appl. No.: 574,596

[22] Filed: Aug. 29, 1990

[30] Foreign Application Priority Data

May 14, 1990 [DE] Fed. Rep. of Germany ....... 4015385

[51] Int. Cl.$^5$ ............................................. C23C 14/00
[52] U.S. Cl. ..................................... 392/389; 118/726
[58] Field of Search ................. 392/388, 389; 118/726, 118/727

[56] References Cited

U.S. PATENT DOCUMENTS

| | | | |
|---|---|---|---|
| 2,554,902 | 5/1951 | Godley | 392/388 |
| 2,969,448 | 1/1961 | Alexander | 392/388 |
| 2,996,418 | 8/1961 | Bleil | 392/389 |
| 3,117,887 | 1/1964 | Shepard | 392/389 |
| 3,231,846 | 1/1966 | Radke | 392/389 |
| 3,372,671 | 3/1968 | Chu | 392/388 |
| 3,387,116 | 6/1968 | Dupuis | 118/726 |
| 4,632,059 | 12/1986 | Flatscher | 392/389 |

Primary Examiner—Teresa J. Walberg
Attorney, Agent, or Firm—Felfe & Lynch

[57] ABSTRACT

A series evaporator for vacuum vapor-deposition apparatus has several evaporators 5 with individual power control, heated by passing through a current, supported on column-like, electrical supply lines 3, 4 wherein the column-like supply lines 3, 4 are held by an electrically conductive support body 6 extending over the entire length of the series evaporator. The supply lines 3 of the one polarity are connected to the support body 6 in an electrically conductive manner whereas the supply lines 4 of the other polarity are passed through the support body 6 in an insulated manner and connected to conducting wires 7 disposed in an insulated manner. Spring elements 8 apply pressure to the supply lines 4 traversing the support body 6 with play a, b, the action of these spring elements being exerted approximately parallel to the longitudinal extension of the evaporator and pressing the top portions 9 of the supply lines 4 against the front surfaces 10 of the evaporator 5 which they face. The spring elements themselves are held and guided in an insulating manner with respect to the support bodies 6 or are made of an insulating material, and the conducting wires 7 connected to these supply lines 4 are conductors passed through by a coolant or are configured as cooling tubes 11 or cooling pipes running parallel to the conducting wires and discharging into chambers or channels 12 provided in the supply lines 4.

7 Claims, 1 Drawing Sheet

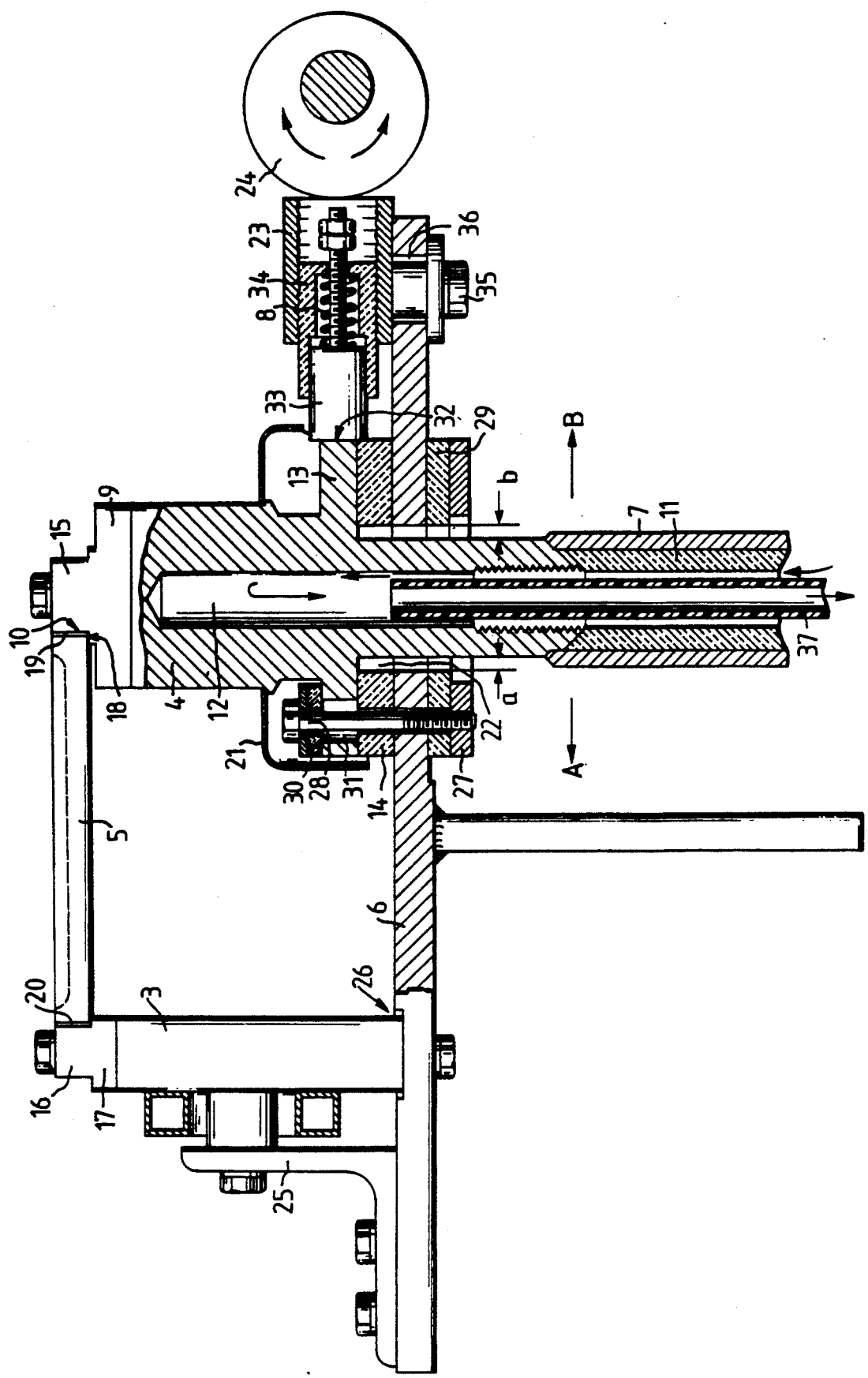

SERIES EVAPORATOR FOR VACUUM VAPOR-DEPOSITION APPARATUS

BACKGROUND OF THE INVENTION

The invention relates to a series evaporator for vacuum vapor-deposition apparatus, in particular for vapor-deposition apparatus for belts, comprising several evaporators with individual power control, heated by a current passed through and mounted on column-like electrical supply lines. These column-like supply lines are held by an electrically conductive support body which extends over the entire length of the series evaporator. Further, the supply lines of the one polarity are connected to the support body in an electrically conductive manner whereas the supply lines of the other polarity are insulated and passed through the support body and connected to conducting wires which are disposed in an insulated manner.

A series evaporator is known (U.S. Pat. No. 3,387,116) where the trough-like evaporation vessel is clamped in between a first stationary, column-like supply line and a thrust piece which is under spring tension and held and guided at a second stationary supply line.

This known device has the disadvantage that a replacement of the evaporation vessel is time-consuming requiring a reduction of the spring tension by means of tools. Further, the removal of the vessel is troublesome since it is not easily accessible.

SUMMARY OF THE INVENTION

The object underlying the present invention is to provide a series evaporator where these disadvantages are avoided and, especially, where the column-like supply lines can be cooled. Further, an evaporator which is not susceptible to contamination and where all flexible or resilient elements are disposed outside the radiating zone of the evaporation source.

This object is accomplished in that spring elements apply pressure to the column-like supply lines which pass through the support body with a certain play. The action of these spring elements is exerted approximately parallel to the longitudinal extension of the evaporators and presses the top portions of the supply lines against the front surfaces of the evaporators which they face. The spring elements themselves are held and guided in an insulated manner with respect to the support body or are made of an insulating material. The conducting wires connected to these supply lines are conductors passed through by a coolant or are configured as cooling tubes or cooling pipes running parallel to the conducting wires an discharging into chambers or channels provided in the supply lines.

BRIEF DESCRIPTION OF THE DRAWING

The sole FIGURE is a lateral and partly sectional view of a device for holding an evaporator of a vacuum vapor-deposition apparatus.

DETAILED DESCRIPTION OF THE PREFERRED EMBODIMENT

The series evaporator essentially comprises a support body 6 configured as a T-shaped profile element. The top of this body 6, by means of threaded connections, is attached to a plurality of parallel disposed, L-like support bodies 25. Column-like supply lines 3 are connected to each of these support bodies 25 and the bottom ends of these lines, also at 26, are firmly attached to the support body 6 in threaded connections.

Each of the supply lines 3 is mounted to a top portion 17 in a threaded connection. Each projection 16 thereof rests against a trough-like evaporator 5 which extends in a plane that is parallel to the support body 6. The end of each evaporator 5 facing away from the supply line 3 rests at the projection 15 of the top portion 9 of a column-like supply line 4 which, as compared to the opposite supply line 3, is held on the support body 6 where it can be moved in a horizontal plane.

In order to allow this movement in direction A and B, indicated by arrows, the supply line is provided with a collar 13 which permits the supply line 4 to rest on an annular insulating piece 14. The lower portion of the supply line 4 extends with play a, b across an opening 22.

A screw 28 joins a bottom guide plate 27 to the collar piece 13 to prevent the supply line 4 from slipping out of the opening 22. Insulating pieces 29, 30 are disposed between the head of screw 28 and the collar piece 13 as well as between the guide plate 27 and the support body 6.

Since the screws 28 also pass through a bore 31 in the collar piece 13 this bore being much larger than the diameter of the shaft of screw 28, there is no electrically conductive connection between supply line 4 and support body 6.

A thrust piece 33 rests against one side 32 of the collar piece 13 and is under the tension of the pressure spring 8. The latter is disposed and supported in an insulating sleeve 34 which in turn is part of guide 23 connected to the support body 6 by means of a screw 35.

Since the screw 35 traverses the bore 36 with play, it is possible to move the guide 23 on the support body to a limited extent. The guide 23 rests on a stationary but rotatably disposed camshaft, i.e. on a gear 24 thereof, so that the force by which spring 8 acts on supply line 4 in direction A can be adjusted.

Supply line 4 is connected to the tubular conducting wire 7 in an electrically conducting manner. This conducting wire 7 surrounds a tube 11 through which coolant is pumped into channel 12. This coolant, after passing through chamber 12, can then be discharged via a tube or flexible pipe 37.

Between the projections 16, 15 of the two column-like supply lines 3, 4 and the evaporators 5 supported or clamped therebetween, there are graphite foils 19, 20 which serve the purpose of providing a largely loss-free transition of current between the supply lines 3, 4 and the evaporator 5.

If the camshaft or the cam gear 24 is now rotated with respect to the position represented, then the tension force of spring 8 acting on the evaporator 5 is reduced allowing supply line 4 a small escape movement in direction B. The evaporator 5 can then be replaced by another one of the same length without further problems.

Further, a shield-like bellows 21 is provided at the collar piece 13 of the column-like supply line 4. It ensures that no evaporation residues or other contaminating material enter the bores 22 and 31 impairing the free movement of supply line 4.

We claim:

1. Series evaporator for vacuum vapor-deposition apparatus, in particular vapor-deposition apparatus for belts, comprising several evaporators 5 with individual power control, heated by passing through a current, supported on column-like, electrical supply lines 3, 4 wherein the column-like supply lines 3, 4 are held by an electrically conductive support body 6 extending over the entire length of the series evaporator, and the supply lines 3 of the one polarity are connected to the support body 6 in an electrically conductive manner whereas the supply lines 4 of the other polarity are passed through the support body 6 in an insulated manner and connected to conducting wires 7 disposed in an insulated manner, characterized in that spring elements 8 apply pressure to the supply lines 4 traversing the support body 6 with play a, b, the action of these spring elements being exerted approximately parallel to the longitudinal extension of the evaporator and pressing the top portions 9 of the supply lines 4 against the front surfaces 10 of the evaporator 5 which they face, wherein the spring elements themselves are held and guided in an insulating manner with respect to the support bodies 6 or are made of an insulating material, and the conducting wires 7 connected to these supply lines 4 are conductors passed through by a coolant or are configured as cooling tubes 11 or cooling pipes running parallel to the conducting wires and discharging into chambers or channels 12 provided in the supply lines 4.

2. Series evaporator in accordance with claim 1, characterized in that the column-like supply lines 4 have flange-like collar pieces 13, with these collar pieces 13 and with interposed insulating pieces 14, they rest on the support body 6.

3. Series evaporator in accordance with claim 2 wherein the spring elements are levers which are disposed at the support body where they can be flipped out and to which pressure is applied by pressure springs and which are supported on the column-like supply lines via thrust pieces made of an insulating material.

4. Series evaporator in accordance with claim 1 wherein the top portion 9 of each column-like supply line 4 has a recess or projection 15 at one end, each forming a horizontally extending surface 18 on which there rests one end of a respective evaporator 5 as well as a vertically extending surface on which there rests the respective front surface 10 of the evaporator with a graphite foil 19 being inserted between the front surface of the evaporator and the support surface of supply line 4.

5. Series evaporator in accordance with claim 1 wherein the column-like supply lines 4 which are connected to the coolant-pumping high-current lines 7 have bellows 21 extending over the flange-like collar pieces 13, wherein the lower, open edges of the bellows 21 end in the area of the top side of the support body 6 thus preventing a contamination of the opening 22 in the support body 6.

6. Series evaporator in accordance with claim 1 wherein the spring element 8 which acts on the movable, column-like supply line 4 is held and guided in a guide 23 which in turn is disposed on the top side of the support body 6, and the distance f thereof to the column-like supply line 4 can be adjusted via a rotatable cam gear 24 disposed on the support body.

7. Series evaporator in accordance with claim 1 wherein the column-like supply line 4, which is connected to the high-current supply 7 is mounted to a carriage interacting with the support body 6 thus allowing the supply line 4 to be moved with respect to opening 22 in longitudinal direction of the evaporator 5, excluding, however, a shift in vertical direction.

* * * * *